(12) United States Patent
Chang

(10) Patent No.: US 7,135,740 B2
(45) Date of Patent: Nov. 14, 2006

(54) HIGH VOLTAGE FET SWITCH WITH CONDUCTIVITY MODULATION

(75) Inventor: Hsueh-Rong Chang, Thousand Oaks, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 285 days.

(21) Appl. No.: 10/952,220

(22) Filed: Sep. 27, 2004

(65) Prior Publication Data
US 2006/0071295 A1    Apr. 6, 2006

(51) Int. Cl.
*H01L 29/76* (2006.01)

(52) U.S. Cl. ................................ 257/341; 438/270

(58) Field of Classification Search ........ 257/328–331, 257/336, 339, 341, 342, 471, 472, E21.419, 257/E29.131, E29.26; 438/259, 268, 270–272, 438/576
See application file for complete search history.

(56) References Cited

U.S. PATENT DOCUMENTS

| | | | |
|---|---|---|---|
| 6,696,706 B1 | 2/2004 | Pegler | 257/235 |
| 6,903,418 B1* | 6/2005 | Iwamoto et al. | 257/342 |
| 2004/0155287 A1 | 8/2004 | Omura et al. | |

FOREIGN PATENT DOCUMENTS

| | | |
|---|---|---|
| DE | 10147696 | 4/2003 |
| EP | 0434914 | 7/1991 |

OTHER PUBLICATIONS

Power Semiconductor Devices, *Insulated Gate Bipolar Transistor*, Chapter 8, p. 246, B.Jayant Baliga, North Carolina State University, PWS Publishing Company, copyright 1996.

500-V n-Channel Insulated-Gate Bipolar Transistor with a Trench Gate Structure, H.-R. Chang, B.Jayant Baliga, *IEEE Transactions on Electron Devices*, vol. 36, No. 9, Sep. 1989.

High-Voltage Accumulation-Layer UMOSFET's in 4H-SiC, J. Tan, JaA. Cooper, Jr., M.R. Melloch, *IEEE Electron Device Letters*, vol. 19, No. 12, Dec. 1998.

Sakai, E. et al., "MOFSET Synchronous Ractifier With Saturable Transformer Commutation For High Frequency Converters", Proceedings of Annual Power Electronics Specialists Conference, IEEE, 1993, pp. 1024-1030.

Chang, H-R et al., "Development And Demonstration Of Silicon Carbide (SiC) Inverter Module In Motor Drive", 2003 IEEE 15th ISPSD, Apr. 14-17, 2003, pp. 131-134.

Chang, H-R et al., "1500V And 10A SIC Motor Drive Inverter Module", Proceedings of 2004 International Symposium on Power Semiconductor Devices & ICS, Kitakyushu, pp. 351-352.

* cited by examiner

Primary Examiner—David Vu
(74) Attorney, Agent, or Firm—Koppel, Patrick & Heybl

(57) ABSTRACT

A high power FET switch comprises an N– drift layer, in which pairs of trenches are recessed to a predetermined depth; oxide side-walls extend to the trench bottoms, and each trench is filled with a conductive material. N+ and metal layers on opposite sides of the drift layer provide drain and source connections for the FET, and the conductive material in each trench is connected together to provide a gate connection. A shallow P region extends across the bottom and around the corners of each trench's side-walls into the drift layer. The application of a sufficient gate voltage causes holes to be injected from the shallow P regions into the N– drift layer, thereby modulating the drift layer's conductivity and lowering the device's on-resistance, and enabling current to flow between the drain and source connections.

30 Claims, 8 Drawing Sheets

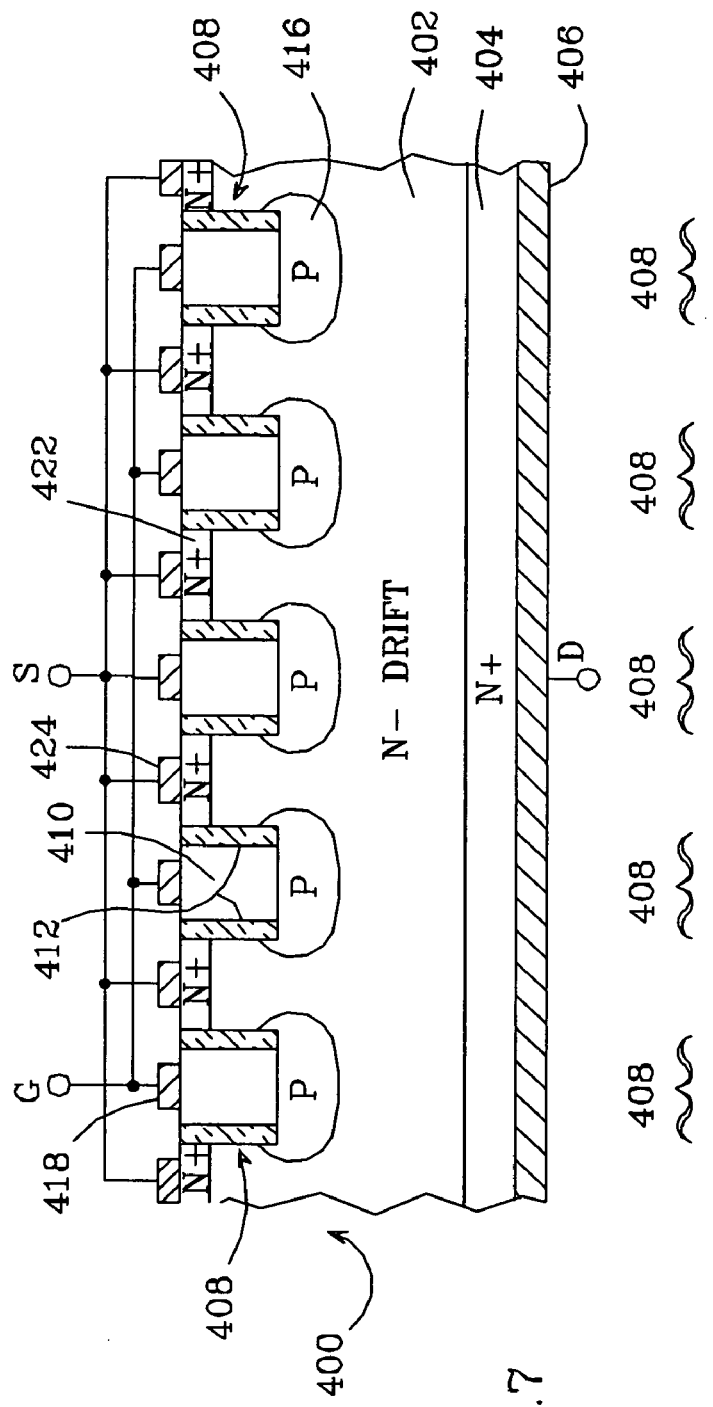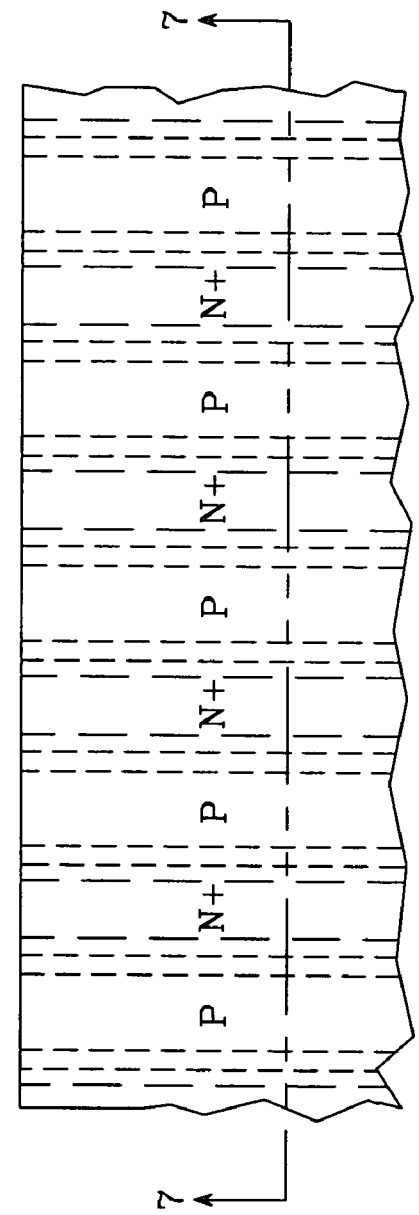
FIG. 7
FIG. 8

HIGH VOLTAGE FET SWITCH WITH CONDUCTIVITY MODULATION

BACKGROUND OF THE INVENTION

1. Field of the Invention

This invention relates to the field of high power semiconductor switches.

2. Description of the Related Art

Semiconductor devices are increasingly required to accommodate high currents and/or high voltages without failing. Many high power applications call for the use of a semiconductor switch which is required to conduct a large current when turned on, and to block a high voltage when off.

One device used in such applications is the power metal-oxide-semiconductor field-effect transistor (MOSFET). As discussed in J. Baliga, *Power Semiconductor Devices*, PWS Publishing Co. (1996) at p. 426, a power MOSFET exhibits excellent fast switching capability and safe-operating-area. When designed to block relatively low voltages (less than 200 volts), the power MOSFET has a low on-resistance. However, on-resistance increases very rapidly when its breakdown voltage is increased. This makes the on-state power losses unacceptable where high DC supply voltages are used.

Another approach which has been explored to improve blocking voltage while maintaining low on-resistance has been the fabrication of FETs using silicon carbide (SiC). SiC has a wider bandgap than does silicon, giving it a "critical electric field"—i.e., the peak electric field that a material can withstand without breaking down—that is an order of magnitude higher than that of silicon (Si). This allows much higher doping and a much thinner drift layer for a given blocking voltage, resulting in a very low specific on-resistance in SiC-based devices.

Unfortunately, many SiC devices developed to date exhibit severe commercialization constraints. One such device is described in "High-Voltage Accumulation-Layer UMOSFET's in 4H-SiC", IEEE Electron Device Letters, Vol. 19, No. 12 (December 1998), pp. 487–489. This SiC-based device employs a UMOS structure, with an accumulation channel formed on the sidewalls of the trench by epitaxial growth to attain enhancement mode operation. It requires an additional epitaxial layer under the p-base to promote current spreading and achieve low on-resistance. The doping levels and the thicknesses of the sidewall epilayer and the epilayer under the p-base must be tightly controlled to achieve an enhancement mode device with low on-resistance. These demands result in a complex fabrication process which is unsuitable for large-scale manufacturing.

Another high power device is the insulated-gate bipolar transistor (IGBT). An IGBT with a trench gate structure is described, for example, in H.-R. Chang and B. Baliga, "500-V n-Channel Insulated-Gate Bipolar Transistor with a Trench Gate Structure", IEEE Transactions on Electron Devices, Vol. 36, No. 9, September 1989, pp. 1824–1828. In operation, a positive gate voltage forms N-type inversion layers, through which electrons flow to provide the base drive needed to turn on the device's PNP transistor.

However, the IGBT has disadvantages which render it unsuitable for some applications. Because the structure is basically a transistor with gain, there will be some recombination in its N− drift region, causing the device to exhibit a high forward voltage drop ($V_{FD}$). Another drawback to IGBTs is that they can "latch-up", at which point they are no longer under the control of the gate voltage. When in this mode, conduction through the device can no longer be controlled by the gate voltage.

SUMMARY OF THE INVENTION

A high power field-effect transistor (FET) switch is presented which overcomes the problems noted above. The switch is particularly well-suited to high power switching applications, providing a very low on-resistance, a high blocking voltage, and negligible switching loss.

An N− drift layer is on an N+ layer which provides an ohmic contact to the drift layer. A layer of metal on the N+ layer provides a drain connection for the FET. A pair of trenches are recessed into the drift layer to a predetermined depth opposite the N+ layer, the predetermined depth defining the "bottom" of the trenches. Layers of oxide line the sides of the trenches to form oxide side-walls that extend to the trench bottoms. Each trench is filled with a conductive material. A second layer of metal connects the conductive material in each trench to provide a gate connection for the FET. A shallow P region extends across the bottom and around the corners of each trench's side-walls into the drift layer. A second N+ layer is on the N− drift layer located between the recessed trenches—referred to as the "mesa region"—which provides an ohmic contact to the N− drift layer; a third layer of metal contacts the second N+ layer to provide a source connection for the FET.

The switch structure is arranged such that the application of a positive voltage to the gate connection greater than the built-in potential that exists between the shallow P regions and the N− drift layer causes holes to be injected from the shallow P regions into the N− drift layer thereby modulating the N− drift layer's conductivity, turning the switch on, and enabling current to flow between the drain and source connections via the mesa region. The ohmic contacts and conductivity modulation combine to provide a low on-resistance for the switch.

Further features and advantages of the invention will be apparent to those skilled in the art from the following detailed description, taken together with the accompanying drawings.

BRIEF DESCRIPTION OF THE DRAWINGS

FIG. 3 is a sectional view of the switch of FIG. 1, illustrating its operation when on.

FIG. 7 is a cross-sectional view of a multiple-cell implementation of a switch per the present invention, cut along section lines 7—7 in FIGS. 8, 9a, and 9b.

FIG. 8 is a plan view of one embodiment of a multiple-cell implementation of a switch per the present invention.

DETAILED DESCRIPTION OF THE INVENTION

Figure 1:
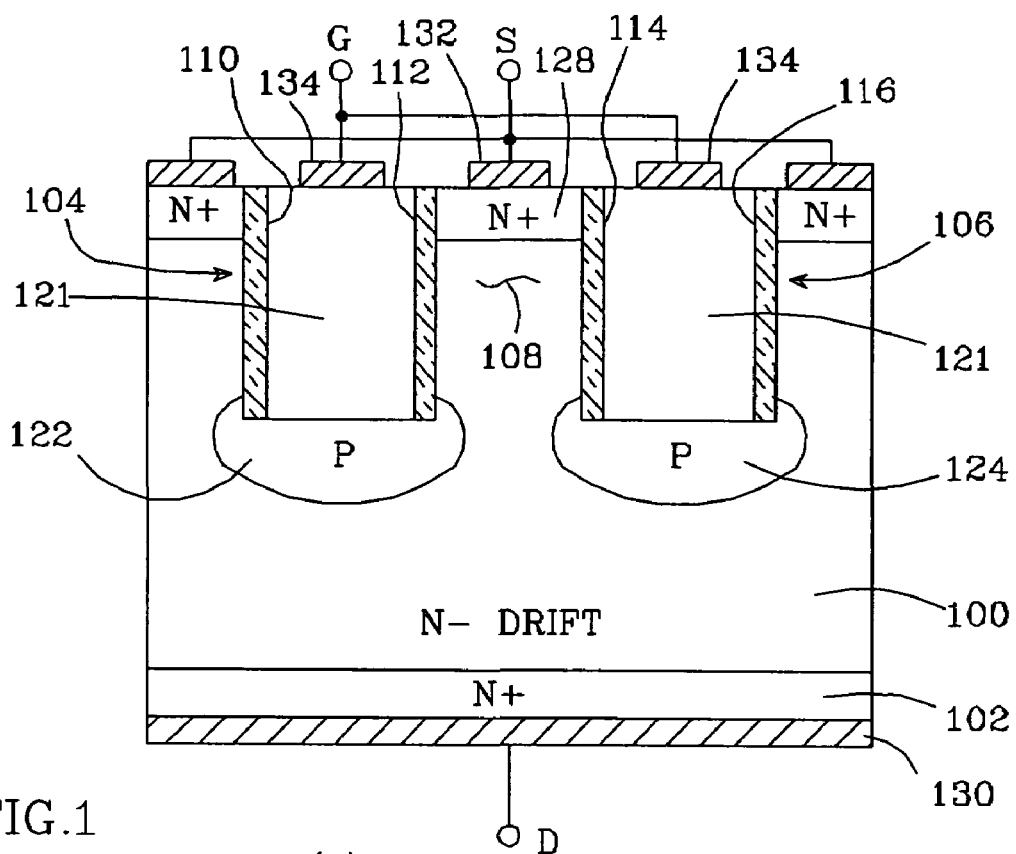
FIG. 1 is a sectional view of one embodiment of a FET switch per the present invention.

An exemplary embodiment of a FET switch in accordance with the present invention is shown in FIG. 1. A N– drift layer 100 of a desired thickness is on a first N+ layer 102. Recessed into drift layer 100 opposite the N+ layer are a pair of trenches 104, 106, which are separated by a mesa region 108 comprised of that portion of the N– drift layer found between the trenches. The trenches are recessed to a predetermined depth, with the depth defining each trench's "bottom". Each trench has oxide side-walls 110, 112, 114, 116, and is filled with a conductive material 121. At the bottom of each trench is a shallow P region 122, 124, which extends across the bottom and around the corners of each trench's side-walls into the drift layer. A second N+ layer 128 is on N– drift layer 100 within mesa region 108.

The first N+ layer 102 provides an ohmic contact to drift layer 100, and a first layer of metal 130 on N+ layer 102 provides a drain connection for the FET switch. The second N+ layer 128 provides an ohmic contact to mesa region 108, and a second layer of metal 132 on N+ layer 128 provides a source connection for the switch. A third layer of metal 134 contacts the conductive material 121 in each of the trenches, providing a gate connection for the FET switch.

Figure 2:
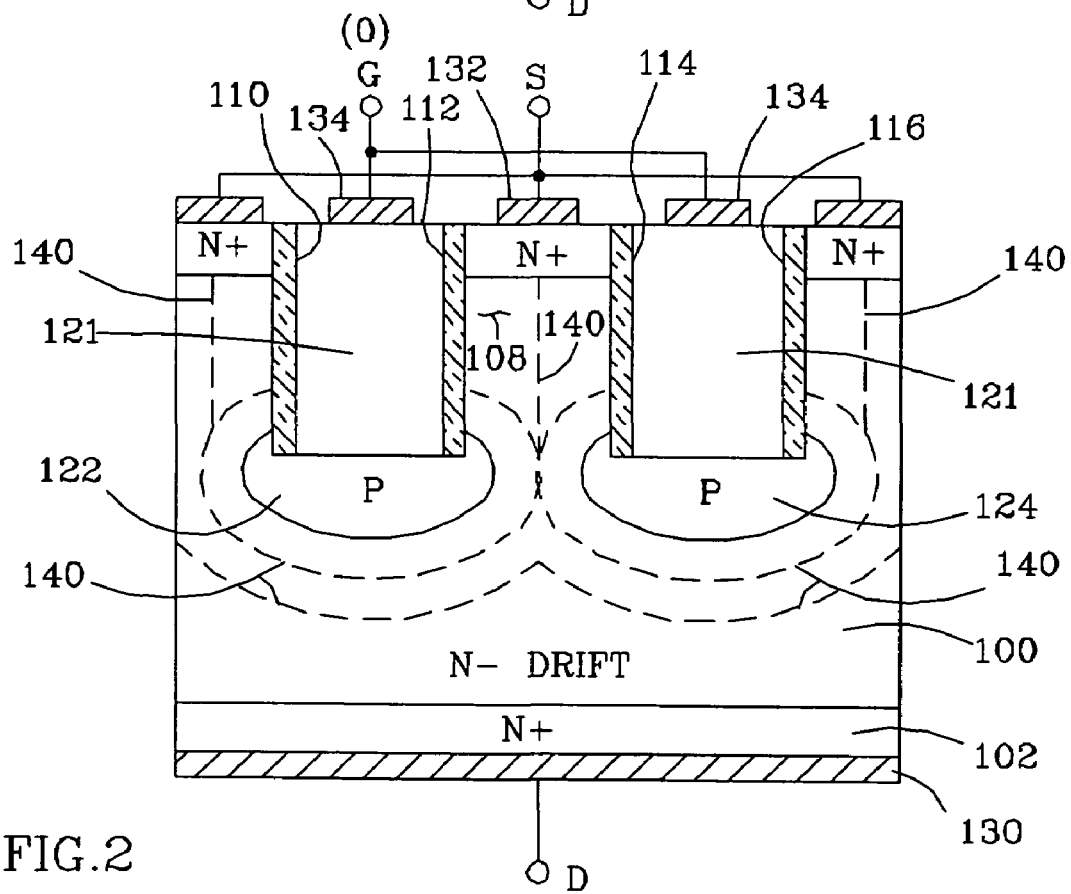
FIG. 2 is a sectional view of the switch of FIG. 1, illustrating its operation when off.

The structure of the novel switch when "off" is illustrated in FIG. 2. The switch is turned "off" by lowering gate voltage $V_g$ toward a negative voltage sufficient to reverse-bias the junction between shallow P regions 122, 124 and N– drift region 100. This causes depletion regions 140 to form around each P region 122, 124 and adjacent to the oxide sidewalls 110, 112, 114, 116, which merge in mesa region 108 to form a potential barrier for electrons, preventing the flow of current between drain 130 and source 132. The $V_g$ value needed to turn the device off has several factors, the most significant of which is the mesa width: a lower $V_g$ value is required to turn the device off for a narrower mesa than for a wider mesa.

Figure 3:
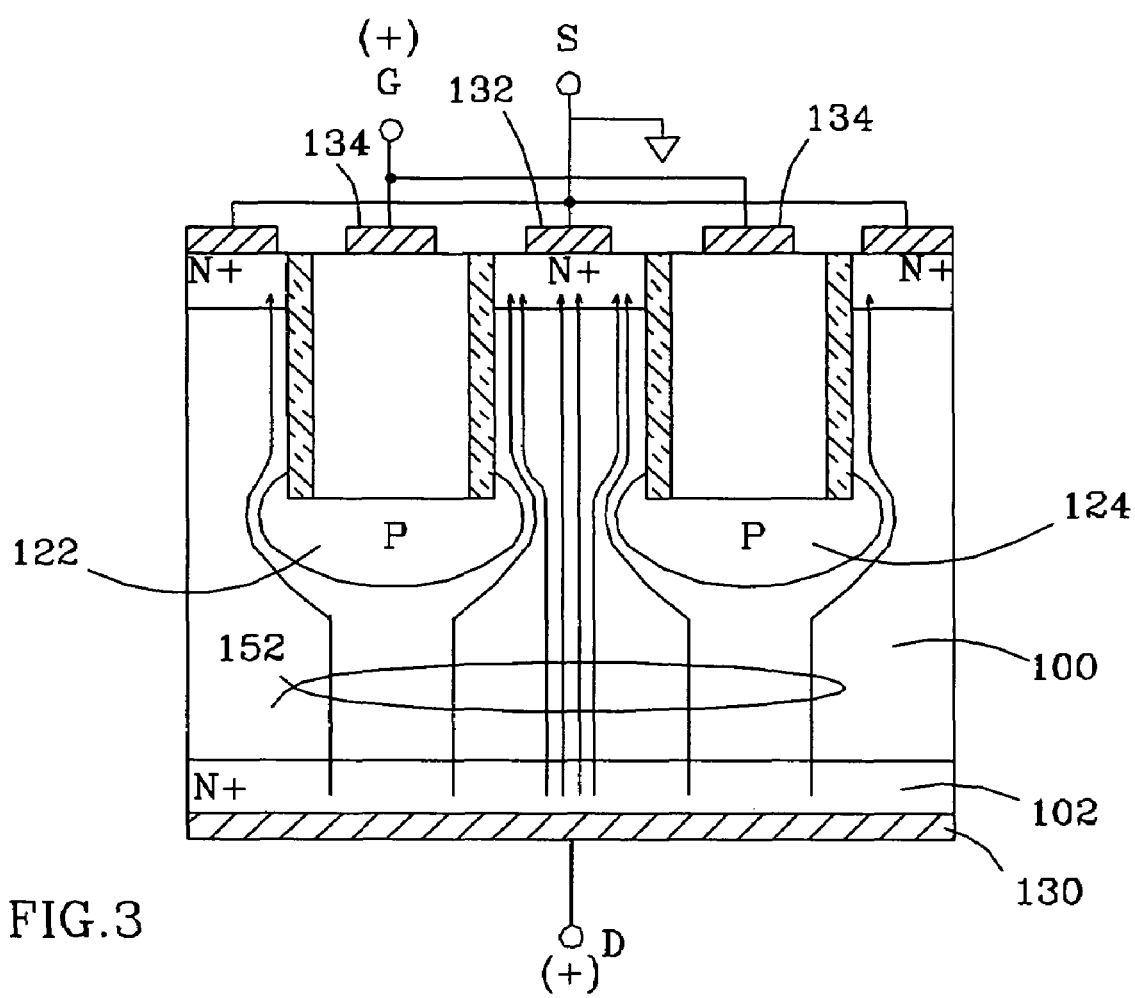

FIG. 3 illustrates how the switch of FIG. 1 is turned "on". A positive voltage, sufficient to overcome the built-in potentials of the p-n junctions present at the interfaces between P regions 122, 124 and N– drift region 100, is applied to gate connection 134. The positive gate voltage allows holes to be injected from P regions 122, 124 into N– drift region 100. Injecting holes (i.e., minority carriers) into drift region 100 makes it a bipolar region, modulates the drift region's conductivity, and reduces the drift region's on-resistance. This turns the switch on, such that current 152 is allowed to flow from drain 130 to source 132 via mesa regions 108.

Figure 4:
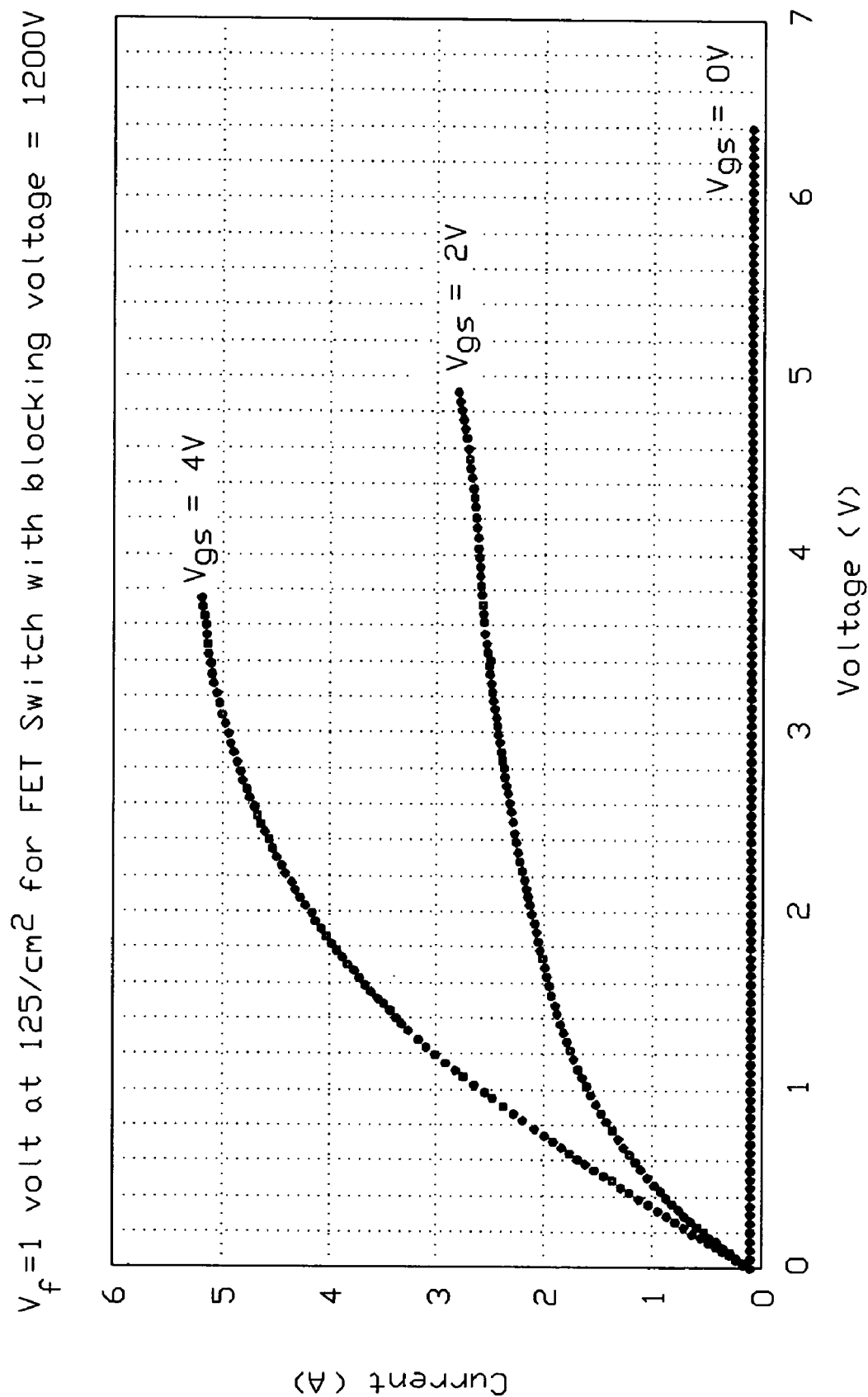
FIG. 4 is a graph plotting drain current vs. drain bias at several different gate-source voltages for a FET switch per the present invention.

The degree of conductivity modulation attained in the drift region is regulated with the voltage applied to gate terminal 134. Simulated plots of the on-state characteristics of the novel switch are shown in FIG. 4, which plots drain current versus drain bias voltage for gate-to-source voltages of 0, 2 and 4 volts. Note, however, that though the device's on-resistance decreases with increasing gate voltage, the device's switching speed decreases as the number of holes injected into drift region 100 increases, due to recombination between holes and electrons in drift region 100.

If the voltage ($V_g$) applied to the gate terminal is less than the p-n junctions' built-in potentials (~3 volts), the p-n junctions will not be forward-biased, no holes will be injected into drift region 100, and the drift region will be unipolar. But as $V_g$ increases, the depletion layer shrinks, hole injection begins, and on-resistance is reduced (but switching speed is also reduced).

The device is preferably arranged such that a negative gate voltage is required to form the potential barrier needed to turn the device off. That is, with no voltage applied to gate connection 134, mesa region 108 should not be completely depleted by the potentials created by the work function difference between the conductive material 121 and N– drift layer 100. If the device were arranged such that the mesa region were completely depleted with $V_g$=0, the device's on-resistance may be unacceptably high.

The trenches are preferably recessed vertically into the N– drift region; i.e., with their side-walls approximately perpendicular to the top surface of the drift layer 100. However, the invention is not limited to vertically-recessed trenches: each trench may be wider at the top than it is at the bottom, or vice versa. Trenches that are wider at the top than at the bottom make the mesa region wider between the trench bottoms, which tends to lower the switch's on-resistance but may degrade its blocking voltage. Trenches that are wider at the bottom constrict the mesa region, which may increase on-resistance but improve blocking voltage. Vertically-recessed trenches provide a good balance between on-resistance and blocking voltage, and are preferred.

Referring back to FIG. 1: the conductive material 121 in trenches 104 and 106 is preferably polysilicon which has been heavily-doped with acceptors. Polysilicon is preferred because it easily fills the trenches, but other materials that can fill the trenches and provide good conductivity could also be used.

When the switch is required to have a high blocking voltage (i.e., greater than about 300 volts), its N+ and N– drift layers, and shallow P regions 122, 124, are preferably made from a semiconductor material having a bandgap voltage that is higher than that of silicon (Si), such as silicon carbide (SiC), gallium nitride (GaN), or diamond. The peak electric field that a material can withstand without breaking down, i.e., its "critical field", is proportional to its bandgap voltage. Thus, an SiC layer, for example, is able to sustain a peak field that is about 10 times greater than that supportable by an Si layer of comparable thickness.

Furthermore, the doping concentration a material is capable of attaining is proportional to its critical field. Thus, SiC's higher critical field enables the switch's material layers to have a doping concentration that is an order of magnitude higher than is possible with Si (~$5 \times 10^{15}$ vs. ~$8 \times 10^{13}$ carriers/cm$^3$). For example, a switch with a 1200 volt blocking voltage could be provided with a drift layer made from Si having a doping density of about $8 \times 10^{13}$ carriers/cm$^3$ which is about 120 μm thick, or with an SiC drift layer having a doping density of about $5 \times 10^{15}$ carriers/cm$^3$ which is about 12 μm thick.

The higher doping concentration achievable with a wide-bandgap material also lowers the device's on-resistance when compared with an Si implementation. Use of a wide-bandgap material also reduces reverse leakage current. SiC's wide bandgap enables a device's reverse leakage current to be several orders of magnitude less than an Si-based device of comparable thickness. This factor also serves to increase the temperature at which the switch can be operated. Because reverse leakage current increases exponentially with temperature, conventional devices must be operated at lower temperatures to achieve leakage currents as low as that provided by an SiC implementation. Conversely, a switch fabricated from a wide-bandgap material such as SiC can be operated at higher temperatures while still meeting a given reverse leakage current specification.

The device's reverse blocking capability is determined by a number of factors, including the structure's mesa width, and the doping and thickness of N− drift layer 100. A wider mesa width tends to lower the device's on-resistance, but also lowers its blocking voltage. Conversely, a narrower mesa width improves the device's blocking capability, but also increases on-resistance.

The present device's use of conductivity modulation is particularly beneficial for devices requiring a high reverse blocking voltage. Reverse blocking voltage increases with increasing thickness and decreasing doping level of the N− drift region. Unfortunately, a thick and lightly-doped drift region tends to have a high resistance. However, the conductivity modulation in the N− drift region attained by virtue of the structure described herein acts to significantly lower on-resistance, thereby enabling the fabrication of a device having a thick and lightly-doped drift region to provide a high reverse blocking voltage, while still providing a low on-resistance.

The shallow P regions 122 and 124 protect the trench oxide from high electric fields. Thus, the doping of the shallow P regions should be sufficient to prevent them from becoming completely depleted when subjected to the switch's rated breakdown voltage. The shallow P regions 122, 124 extend around the trench corners, to protect the corners from premature breakdown caused by high electric fields; this improves the reliability of the trench oxide and enhances the robustness of the switch's breakdown voltage characteristic.

The P regions are preferably made shallow to limit lateral diffusion. To further limit lateral diffusion, it is preferred that the P regions comprise a slow-diffusing material. For an SiC implementation of the switch, the preferred material for the shallow P regions is aluminum.

Careful consideration must be given to the width of the mesa region, and the widths and depths of the trenches. For example, if a mesa is too narrow, lateral diffusion around the P regions 122, 124 may act to pinch off the conductive path and block current flow. If too wide, the reverse blocking voltage may be adversely affected.

Figure 5:
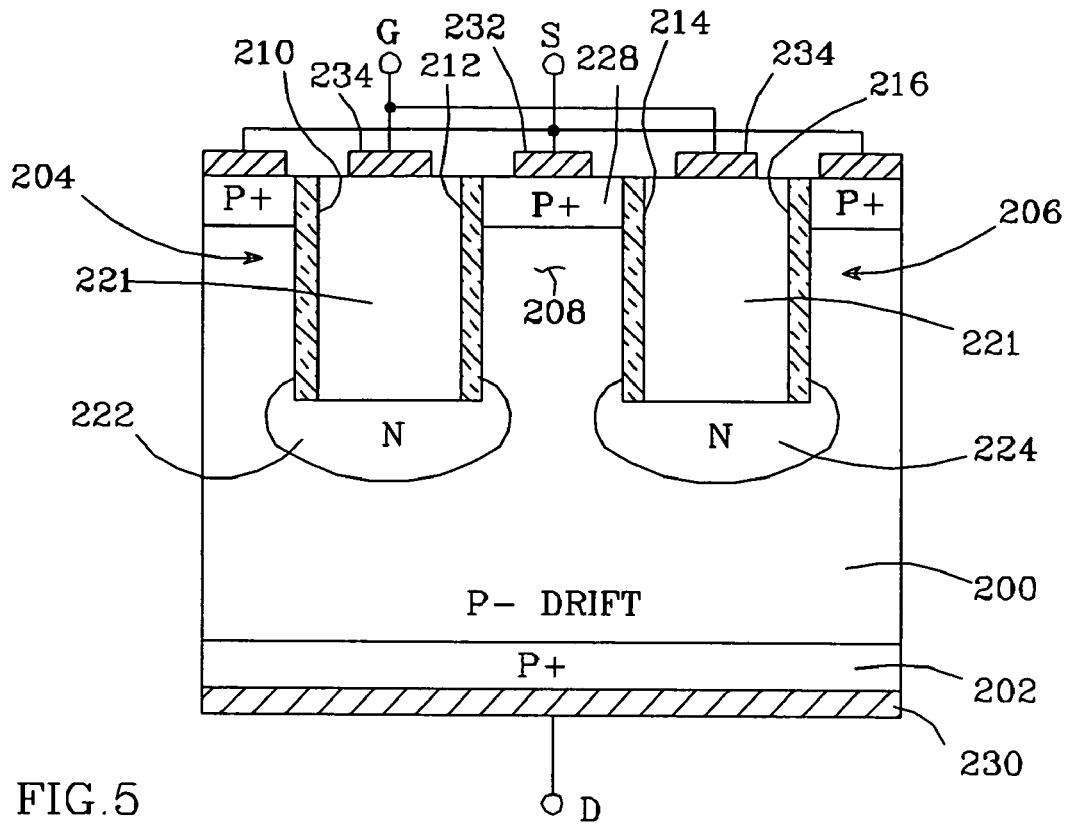
FIG. 5 is a sectional view of an opposite polarity version of the switch of FIG. 1.

The present FET switch is not limited to the structure shown in FIG. 1. An opposite polarity embodiment is shown in FIG. 5, in which each of the materials has been swapped with its opposite polarity counterpart. Here, a P− drift layer 200 is on a first P+ layer 202. A pair of trenches 204, 206 are recessed into drift layer 200 opposite P+ layer 202, and are separated by a mesa region 208. Each of the trenches has oxide side-walls 210, 212, 214, 216 and is filled with a conductive material 221. A shallow N region 222, 224 is at the bottom of each trench. A second P+ layer 228 is on P− drift layer 200 within mesa region 208. First P+ layer 202 provides an ohmic contact to drift layer 200, and a first layer of metal 230 on P+ layer 202 provides a drain connection for the FET switch. The second P+ layer 228 provides an ohmic contact to mesa region 208, and a second layer of metal 232 on P+ layer 228 provides a source connection for the switch. A third layer of metal 234 contacts conductive material 221 in each of the trenches, providing a gate connection for the switch. The conductive material is preferably polysilicon which has been heavily-doped with donors.

The switch functions as before, except that the switch is turned on by applying a negative gate voltage to gate connection 234 sufficient to overcome the built-in potentials of the p-n junctions present at the interfaces between N regions 222, 224 and P− drift region 200. This allows current to flow from source 232 to drain 230. A positive gate voltage sufficient to reverse-bias the junction between shallow N regions 222, 224 and P− drift region 200 turns the device off.

Figure 6A:
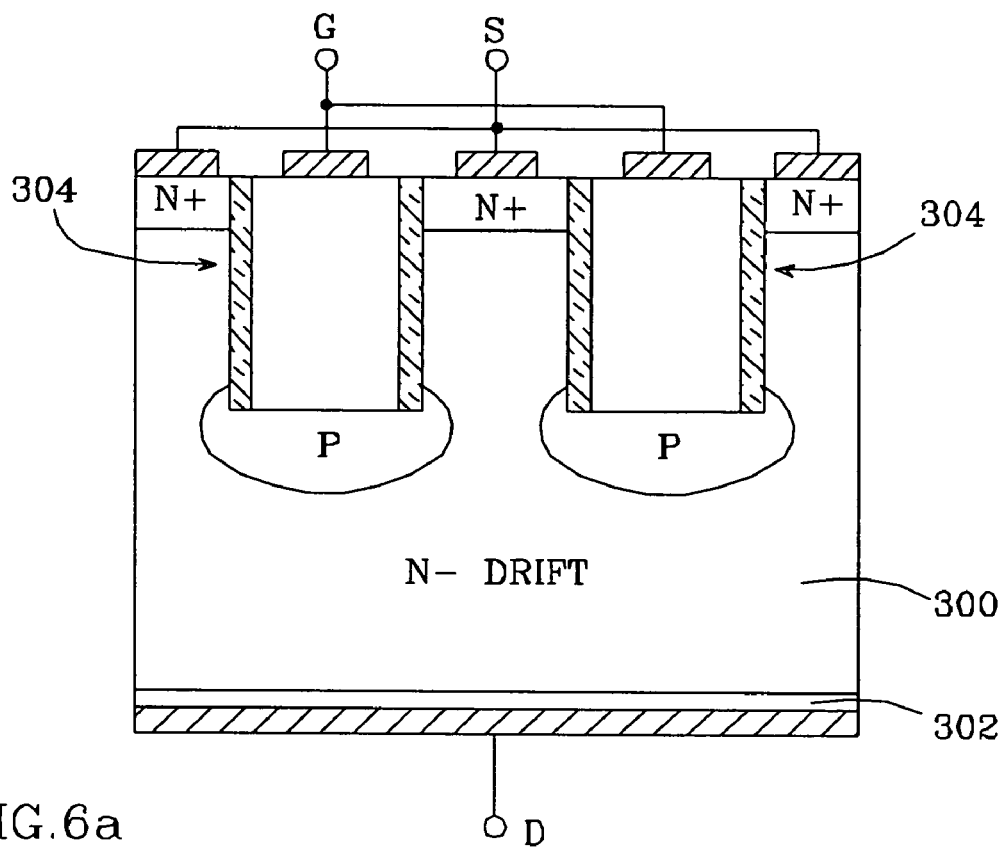
FIG. 6a is a sectional view of alternative embodiment of a switch per the present invention.

The switch can be fabricated on punch-through wafers (EPI), in which the drift layer is an epitaxial layer grown to a desired thickness on a bulk substrate material (as in FIG. 1, with epitaxial drift layer 100 on N+ bulk substrate 102), or on non-punch-through (NPT) wafers. An exemplary embodiment using an NPT wafer is shown in FIG. 6a. Here, the N− drift region 300 is a bulk substrate material, and the N+ region 302 is a very thin layer (0.5 μm or less) of a material having a large supply of donors, such as phosphorus or nitrogen, which has been implanted or diffused into the backside to provide a low resistance ohmic contact; the rest of the structure is similar to that shown in FIG. 1, with a pair of trenches 304 with oxide side-walls and respective shallow P regions recessed into drift layer 300. Several factors should be considered when determining which wafer-type to use. EPI wafers are more expensive than NPT wafers, but because the N− epitaxial layer has a controlled thickness and doping concentration, they offer a lower on-resistance.

Figure 6B:
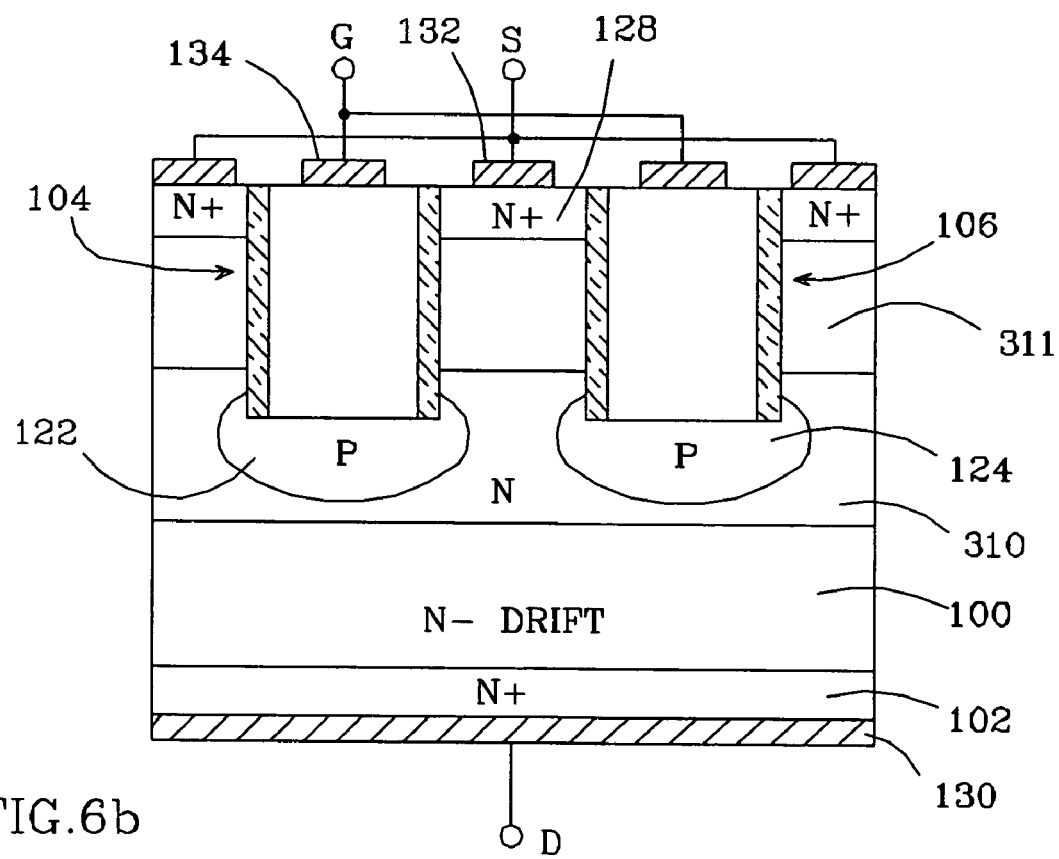
FIG. 6b is a sectional view of another alternative embodiment of a switch per the present invention.

Another possible embodiment of the switch is shown in FIG. 6b. This structure is similar to that of the device in FIG. 1, except for the addition of an N type layer 310 which completely envelops P regions 122 and 124 and extends at least part of the way up to N+ layers 128. Because N type layer 310 is more heavily doped than N− drift layer 100, it reduces the out-diffusion of P material from P regions 122 and 124, thereby reducing the switch's on-resistance. The portion 311 of mesa region 108 found between N type layer 310 and N+ layer 128 may be doped to the same level as the N− drift layer 100; for this embodiment, however, it is preferred that portion 311 be more lightly doped than N-drift layer 100. The reduction in on-resistance a more lightly-doped mesa might otherwise cause is compensated for by the improved on-resistance brought about by N layer 310.

To provide a high power switch, the structures of FIGS. 1, 5, 6a, or 6b—each of which depict an individual device "cell", defined as the area from the midpoint of one trench structure to the midpoint of an adjacent trench structure, are repeated across a die having an area sufficient to provide the necessary current carrying capacity. This is illustrated in the cross-sectional view shown in FIG. 7 of an exemplary high power FET switch. A die 400 has an N− drift layer 402 on an N+ layer 404, with a metal layer 406 on layer 404 providing a drain connection; each of these layers runs approximately the full length and width of the die. A number of trench structures 408 are spaced periodically across the die, each of which has the same structure as the trenches shown in FIG. 1; i.e., filled with a conductive material 410 and having oxide side-walls 412, with a shallow P region 416 at its bottom. A layer of metal 418 contacts the conductive material in each trench to provide a gate connection. Mesa regions 420 are located between each pair of trenches; an N+ layer 422 is on the N− drift material in each of the mesa regions, and a layer of metal 424 connects all of the N+ layers together to provide a source connection.

The switch operates as described above: when a positive gate voltage is applied, holes are injected from P regions 416 into N− drift region 402, thereby modulating the conductivity of the drift region and allowing current to flow between drain and source via the mesa regions.

The trench structures may be arrayed across the die in a wide variety of ways. One arrangement is illustrated in FIG. 8, which is a plan view that corresponds with the cross-sectional view of FIG. 7 (metal layers 406, 418, and 424 not shown for clarity). The trench structures 408 form channels that run the length of the die 400, and are spaced periodically across its width.

Figure 9A:
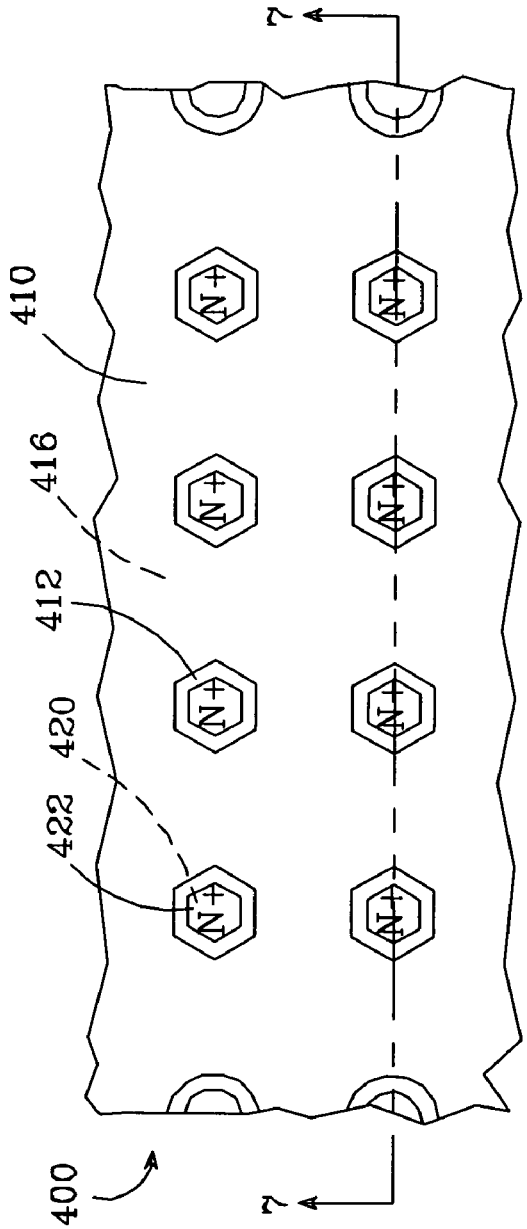
FIG. 9a is a plan view of another embodiment of a multiple-cell implementation of a switch per the present invention.

Another possible trench structure arrangement is shown in FIG. 9a, which also corresponds with the cross-sectional view of FIG. 7. Here, the N+ layers 422 and the mesa regions 420 below them are cylindrical in shape and surrounded with oxide side-walls 412, and are spaced periodically within the die 400. The trench structures' conductive material 410 and the buried P regions 416 occupy the area between the cylindrical mesa regions. Note that an alternative arrangement to that shown in FIG. 9a is also possible, in which the mesa regions 420 and the trench structures 408 are reversed. The trench structures could be circular in shape and surrounded by cylindrical oxide side-walls, and spaced periodically within the die 400, with the trench structures 408 recessed in the area between the mesa regions 420.

Figure 9B:
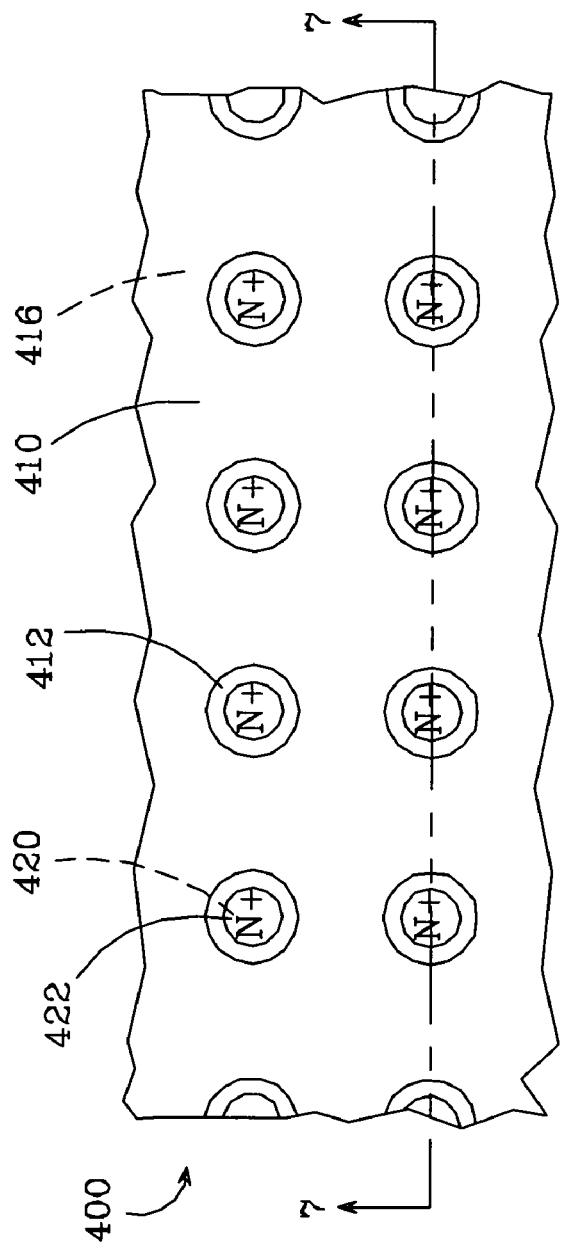
FIG. 9b is a plan view of yet another possible embodiment of a multiple-cell implementation of a switch per the present invention.

The perimeter of each of the mesa regions or trenches may also describe a polygon. One particularly efficient example of this is shown in FIG. 9b, which also corresponds with the cross-sectional view of FIG. 7. Here, the N+ layers 422, the mesa regions 420 below them, and the oxide side-walls 412 surrounding them are hexagonal in shape, and are spaced periodically within the die 400.

The trench structure arrays shown in FIGS. 7–9b are merely exemplary; many other possible trench and mesa geometries and arrangements are possible which will result in switches that adhere to the principles of the invention. It is recommended that square-shaped trenches be avoided, because the high peak fields that appear at the trench corners can result in the premature breakdown of the device.

A "termination" typically surrounds an array of cells as described above, to protect the cells on the outer edges of the array. For the present switch, it is preferable that the termination depth extend well into the drift layer. This serves to better protect the outlying trench structures, and reduces the sharpness of the termination's corners, which enhances the termination's ability to protect the trenches from high electric fields.

When the drift layer is N type material, the termination is typically P type. Thus, the termination may be formed with the same P type material as is used for the buried P regions below each trench. This is not recommended for an SiC implementation, however: aluminum is the preferred material for the P regions, because it is slow-diffusing in SiC and can thus limit lateral diffusion. The termination, on the other hand, is preferably fast-diffusing. As such, a fast-diffusing material such as boron is preferred for the termination around an SiC device.

As noted above, a high power switch is provided by employing an array of switch cells across a die. When so arranged, a switch as described herein can support a current density of at least 125 A/cm$^2$ with a forward voltage drop of 1 volt.

Figure 10:
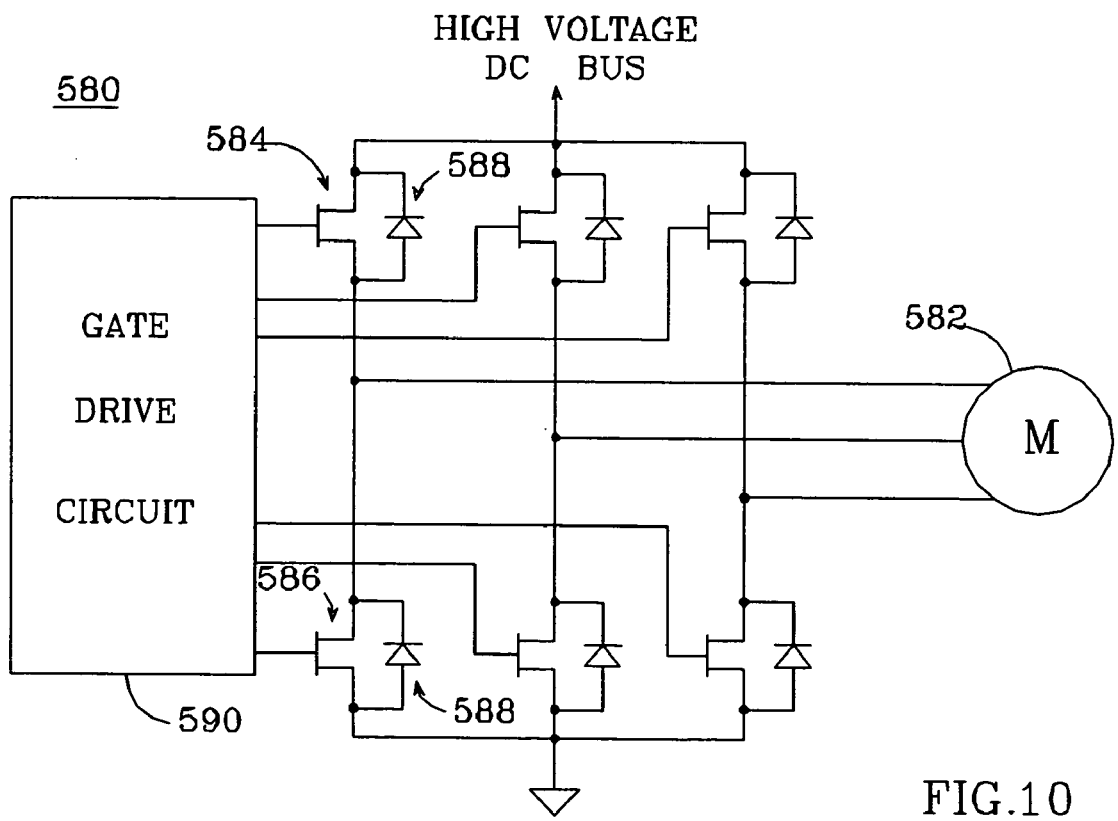
FIG. 10 is a schematic diagram of pulse-width modulated motor control circuit employing FET switches per the present invention.

One application of a switch per the present invention is illustrated in FIG. 10. As described in J. Baliga (ibid.) at p. 575–577, a PWM motor control circuit 580 provides variable frequency AC power to a 3-phase AC motor 582 using six switching transistors and six flyback diodes. Each switch is made from two transistors connected in a totem-pole configuration: one switch (typical of all the switches), is made from a pair of transistors 584, 586 per the present invention, connected in series between a high voltage DC bus and ground, with a flyback diode 588 connected across each transistor. The switching transistors are driven by a gate drive circuit 590, which regulates power to the motor by adjusting the time duration for the on and off states of each switch.

Ideally, the switching transistors used in a motor control circuit application have a high blocking voltage, a low on-resistance, fast switching speed and low switching losses. The FET switch described herein offers all of these characteristics, making it well-suited for use in a motor control circuit.

Figure 11:
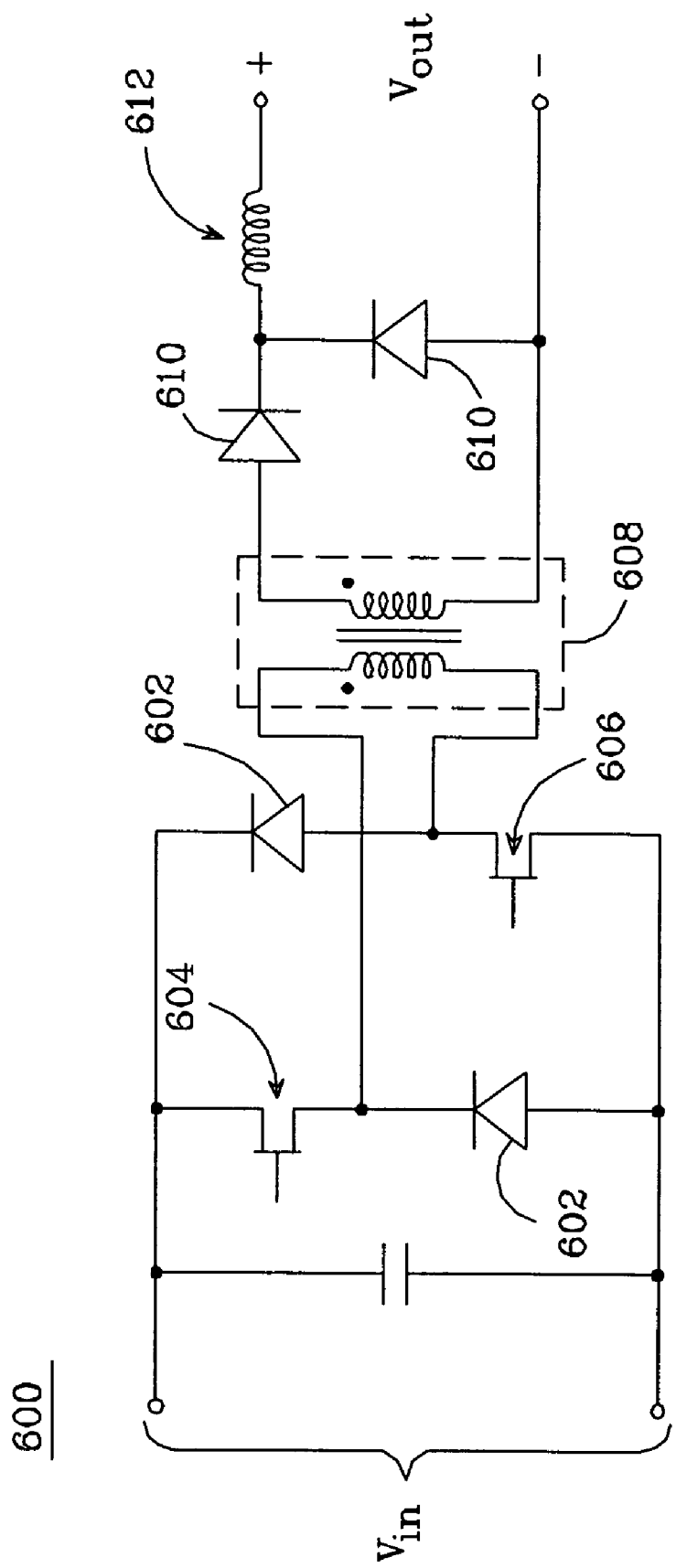
FIG. 11 is a schematic diagram of switching voltage regulator employing FET switches per the present invention.

Another suitable application for the present switch is shown in FIG. 11, which depicts a basic switching voltage regulator 600. Two rectifiers 602 are employed on the primary side of the regulator, connected in series with respective switching transistors 604 and 606; both transistor/rectifier branches are connected across an input voltage $V_{in}$. The switching transistors 604, 606 conduct a current through the primary side of a transformer 608 when switched on, and the rectifiers 602 conduct the transformer current when the transistors are switched off. Rectifiers 610 are connected to the secondary side of transformer 608 and, with output inductor 612, produce a rectified output voltage $V_{out}$ from the regulator. The switching transistors' fast switching speed and low switching losses make it well-suited for use in switching regulator applications.

The high power FET switch is fabricated using conventional means well-known to those in the art of semiconductor fabrication. Though the device's trench structures require processing steps that are not necessary when fabricating other switch types, such as planar MOSFETs, the additional fabrication complexity is offset by the greatly improved performance of the device when used in high power applications.

While particular embodiments of the invention have been shown and described, numerous variations and alternate embodiments will occur to those skilled in the art. Accordingly, it is intended that the invention be limited only in terms of the appended claims.

I claim:
1. A field-effect transistor (FET) switch, comprising:
an N− drift layer;
a first N+ layer on said N− drift layer which provides an ohmic contact to said N− drift layer;
a first layer of metal on said first N+ layer which provides a drain connection for said FET switch;
a pair of trenches recessed into said N− drift layer to a predetermined depth opposite said N+ layer, said trenches separated by a mesa region comprised of that portion of said N− drift layer found between said pair of trenches, said predetermined depth defining the bottom of said trenches;
layers of oxide lining the sides of said trenches to form oxide side-walls in each trench that extend to the bottom of said trenches;
a conductive material which fills each of said trenches;
a second layer of metal connecting the conductive material in each of said trenches together which provides a gate connection for said FET switch;
respective shallow P regions extending across the bottoms of respective trenches into said N− drift layer, each of said shallow P regions extending around the bottom corners of its respective trench's oxide side-walls;

a second N+ layer on said N– drift layer within said mesa region which provides an ohmic contact to said mesa region; and a third layer of metal contacting said second N+ layer which provides a source connection for said FET switch;

such that the application of a positive voltage to said gate connection greater than the built-in potential that exists between said shallow P regions and said N– drift layer causes holes to be injected from said shallow P regions into said N– drift layer thereby modulating said N– drift layer's conductivity and turning said switch on and enabling current to flow between said drain and said source connections via said mesa region; said ohmic contacts and said conductivity modulation combining to provide a low on-resistance for said switch.

2. The FET switch of claim 1, wherein said conductive material is polysilicon which has been heavily-doped with acceptors.

3. The FET switch of claim 1, wherein said conductive material is a metal having a work function that is higher than that of the N– material in said mesa region.

4. The FET switch of claim 1, wherein said trenches are recessed vertically into said N– drift layer such that said side-walls are approximately perpendicular to the top surface of said drift layer.

5. The FET switch of claim 1, wherein said N+ layer, said N– drift layer, and said shallow P regions comprise a semiconductor material having a bandgap voltage greater than that of silicon.

6. The FET switch of claim 5, wherein said N+ layer, said N– drift layer, and said shallow P regions comprise silicon carbide (SiC).

7. The FET switch of claim 6, wherein said N– drift layer has a thickness of about 12 μm and said switch has a blocking voltage of at least 1200 volts.

8. The FET switch of claim 6, wherein said shallow P regions comprise aluminum.

9. The FET switch of claim 5, wherein said N+ layer and said N– drift layer comprise gallium nitride (GaN).

10. The FET switch of claim 5, wherein said N+ layer and said N– drift layer comprise diamond.

11. The FET switch of claim 1, wherein said switch is further arranged such that, with no voltage applied to said gate connection, said mesa region is not completely depleted by the potential created by the work function difference between said conductive material and said N– drift layer.

12. The FET switch of claim 1, wherein said switch is further arranged such that it is turned off by the application of voltage to said gate connection sufficient to reverse bias the junctions between said shallow P regions and said N– drift layer.

13. The FET switch of claim 1, wherein said N+ layer is a bulk substrate material and said N– drift layer is an epitaxial layer grown on said N+ layer.

14. The FET switch of claim 1, wherein said N– drift layer is a bulk substrate material and said N+ layer is implanted or diffused into the backside of said N– layer.

15. The FET switch of claim 1, wherein the structure between the vertical midpoints of each of said trenches comprises a FET cell, further comprising a plurality of additional trenches recessed in said drift layer and spaced periodically in said drift layer with said first pair of trenches, each of said additional trenches having oxide side-walls, a shallow P region at its bottom, and a conductive material within said trench, the conductive material in each of said additional trenches contacting said gate connection, each of said additional trenches forming an additional one of said FET cells, said additional FET cells increasing the current carrying capacity of said FET switch when said switch is turned on.

16. The FET switch of claim 1, further comprising an N type layer which completely envelops said shallow P regions.

17. The FET switch of claim 1, wherein said conductive material is polysilicon which has been heavily-doped with acceptors.

18. A field-effect transistor (FET) switch, comprising:
a P– drift layer;
a first P+ layer on said P– drift layer which provides an ohmic contact to said P– drift layer;
a first layer of metal on said first P+ layer which provides a drain connection for said FET switch;
a pair of trenches recessed into said P– drift layer opposite said P+ layer, said trenches separated by a mesa region comprised of that portion of said P– drift layer found between said pair of trenches;
a layer of oxide lining the sides and bottom of each of said trenches to form oxide side-walls and respective oxide bottoms in each trench;
a conductive material in each of said trenches;
a second layer of metal connecting the conductive material in each of said trenches together which provides a gate connection for said FET switch;
respective shallow N regions extending from the oxide bottoms of respective trenches into said P– drift layer, each of said shallow N regions extending around the corners formed at the intersections of its respective trench's oxide side-walls and its oxide bottom;
a second P+ layer on said P– drift layer within said mesa region which provides an ohmic contact to said mesa region; and
a third layer of metal contacting said second P+ layer which provides a source connection for said FET switch;
such that the application of a negative voltage to said gate connection greater than the built-in potential that exists between said shallow N regions and said P– drift layer causes electrons to be injected from said shallow N regions into said P– drift layer thereby modulating said P– drift layer's conductivity and turning said switch on and enabling current to flow between said drain and said source connections via said mesa region;
said ohmic contacts and said mesa region modulation combining to provide a low on-resistance for said switch.

19. The FET switch of claim 18, wherein said conductive material is polysilicon which has been heavily-doped with donors.

20. The FET switch of claim 18, wherein said P+ layer, said P– drift layer, and said shallow N regions comprise a semiconductor material having a bandgap voltage greater than that of silicon.

21. The FET switch of claim 20, wherein said P+ layer, said P– drift layer, and said shallow N regions comprise silicon carbide (SiC).

22. The FET switch of claim 21, wherein said P– drift layer has a thickness of about 12 μm and said switch has a blocking voltage of at least 1200 volts.

23. A high power field-effect transistor (FET) switch, comprising:
an N– drift layer;
a first N+ layer on said N– drift layer which provides an ohmic contact to said N– drift layer;

a first layer of metal on said first N+ layer which provides a drain connection for said FET switch;

a plurality of trenches recessed to a predetermined depth opposite said N+ layer and spaced periodically in said N− drift layer, each pair of adjacent trenches separated by a respective mesa region comprised of that portion of said N− drift layer found between said pair of adjacent trenches, said predetermined depth defining the bottom of said trenches;

layers of oxide lining the sides of said trenches to form oxide side-walls in each trench that extend to the bottom of said trenches;

a conductive material in each of said trenches;

a second layer of metal connecting the conductive material in each of said trenches together which provides a gate connection for said FET switch;

respective shallow P regions extending across the bottoms of respective trenches into said N− drift layer, each of said shallow P regions extending around the bottom corners of its respective trench's oxide side-walls;

respective second N+ layers on said N− drift layer within respective ones of said mesa regions which provide ohmic contacts to said mesa regions; and a third layer of metal contacting each of said second N+ layers which provides a source connection for said FET switch;

such that a positive voltage applied to said gate connection causes holes to be injected from said shallow P regions into said N− drift layer thereby modulating said N− drift layer's conductivity and turning said switch on and enabling current to flow between said drain and said source connections via said mesa regions;

said ohmic contacts and said conductivity modulation combining to provide a low on-resistance for said switch.

24. The high power FET switch of claim 23, wherein said switch is further arranged such that, with no voltage applied to said gate connection, said mesa regions are not completely depleted by the potentials created by the work function differences between said conductive material and said N− drift layer.

25. The high power FET switch of claim 23, wherein said switch resides on a die in which said drift layer, said first N+ layer and said first metal layer run the length and width of said die.

26. The high power FET switch of claim 25, wherein each of said trenches is a channel which runs the length of said die and said trenches are spaced periodically across the width of said die.

27. The high power FET switch of claim 25, wherein each of said mesa regions is approximately cylindrical about a vertical axis, said mesa regions spaced periodically within said die.

28. The high power FET switch of claim 25, wherein the perimeter of each of said mesa regions describes a polygon, said mesa regions spaced periodically within said die.

29. A pulse-width modulated motor control circuit, comprising:

at least one pair of switching transistors connected in a totem-pole configuration between a supply voltage and ground, the junction between said transistors providing an output suitable for connection to an AC motor;

respective flyback rectifiers connected across respective ones of said switching transistors, each of said switching transistors comprising:

an N− drift layer, a first N+ layer on said N− drift layer which provides an ohmic contact to said N− drift layer, a first layer of metal on said first N+ layer which provides a drain connection for said FET switch, a pair of trenches recessed into said N− drift layer to a predetermined depth opposite said N+ layer, said trenches separated by a mesa region comprised of that portion of said N− drift layer found between said pair of trenches, said predetermined depth defining the bottom of said trenches, layers of oxide lining the sides of said trenches to form oxide side-walls in each trench that extend to the bottom of said trenches, a conductive material in each of said trenches, a second layer of metal connecting the conductive material in each of said trenches together which provides a gate connection for said FET switch, respective shallow P regions extending from the oxide bottoms of respective trenches into said N− drift layer, each of said shallow P regions extending around the bottom corners of its respective trench's oxide side-walls, a second N+ layer on said N− drift layer within said mesa region which provides an ohmic contact to said mesa region, and a third layer of metal contacting said second N+ layer which provides a source connection for said FET switch, such that a positive voltage applied to said gate connection modulates said N− drift layer within said mesa region, thereby turning said switch on and enabling current to flow between said drain and said source connections via said mesa region, said ohmic contacts and said conductivity modulation combining to provide a low on-resistance for said switching transistor; and a gate drive circuit which controls the on and off states of each of said switching transistors to regulate the power provided to said motor.

30. A switching voltage regulator, comprising:

a first switching transistor and a first rectifier connected in series across an input voltage;

a second switching transistor and a second rectifier connected in series across an input voltage;

a transformer, said first and second switching transistors connected to conduct a current through the primary side of said transformer when switched on, and said first and second rectifiers connected to conduct said transformer current when said transistors are switched off;

an output circuit connected to the secondary side of said transformer and containing at least one output rectifier, said output circuit arranged to rectify the voltage across said secondary side of said transformer and to produce a rectified output voltage;

each of said first and second switching transistors comprising:

an N− drift layer, a first N+ layer on said N− drift layer which provides an ohmic contact to said N− drift layer, a first layer of metal on said first N+ layer which provides a drain connection for said FET switch, a pair of trenches recessed into said N− drift layer to a predetermined depth opposite said N+ layer, said trenches separated by a mesa region comprised of that portion of said N− drift layer found between said pair of trenches, said predetermined depth defining the bottom of said trenches, layers of oxide lining the sides of said trenches to form oxide side-walls in each trench that extend to the bottom of said trenches, a conductive material in each of said trenches, a second layer of metal connecting the conductive material in each of said trenches together which provides a gate connection for said FET switch, respective shallow P regions extending from the oxide bottoms of respective trenches into said N− drift layer, each of said shallow P regions extending around the bottom corners of its respective trench's oxide side-walls, a second N+ layer on said N− drift layer within said mesa region which provides an ohmic contact to said mesa region, and a third layer of metal contacting said second N+ layer which provides a source connection for said FET switch, such that a positive voltage applied to said gate connection modulates said N− drift layer within said mesa region, thereby turning said switch on and enabling current to flow between said drain and said source connections via said mesa region, said ohmic contacts and said conductivity modulation combining to provide a low on-resistance for said switching transistor.

* * * * *